United States Patent [19]
Gorecki et al.

[11] Patent Number: 5,670,907
[45] Date of Patent: Sep. 23, 1997

[54] VBB REFERENCE FOR PUMPED SUBSTRATES

[75] Inventors: James Gorecki, Hillsboro; Ravindar Lall; Robert B. Lefferts, both of Portland, all of Oreg.

[73] Assignee: Lattice Semiconductor Corporation, Hillsboro, Oreg.

[21] Appl. No.: 403,595

[22] Filed: Mar. 14, 1995

[51] Int. Cl.$^6$ .................................................. G05F 1/10
[52] U.S. Cl. .................. 327/535; 327/538; 327/539; 323/313
[58] Field of Search ............................ 327/535, 536, 327/537, 538, 539, 77; 323/313, 315

[56] References Cited

U.S. PATENT DOCUMENTS

| | | | |
|---|---|---|---|
| 4,562,454 | 12/1985 | Schultz et al. | 357/51 |
| 4,961,007 | 10/1990 | Kumanoya et al. | |
| 4,964,082 | 10/1990 | Sato et al. | 365/189.09 |
| 5,003,197 | 3/1991 | Nojima et al. | 327/536 |
| 5,113,088 | 5/1992 | Yamamoto et al. | 327/537 |
| 5,144,223 | 9/1992 | Gillingham | 323/313 |
| 5,191,555 | 3/1993 | Tabacco et al. | 365/230.08 |
| 5,208,776 | 5/1993 | Nasu et al. | 365/200 |
| 5,220,534 | 6/1993 | Redwine et al. | 365/226 |
| 5,227,675 | 7/1993 | Taguchi | 327/535 |
| 5,309,446 | 5/1994 | Cline et al. | 371/21.1 |
| 5,345,422 | 9/1994 | Redwine | 365/189.09 |

FOREIGN PATENT DOCUMENTS

| | | | |
|---|---|---|---|
| 0015342 | 9/1980 | European Pat. Off. | 323/313 |

OTHER PUBLICATIONS

*Analysis and Design of Analog Integrated Circuits*, 2d. Ed., Paul R. Gray et al., (1977, 1984), pp. 289–296, 736–737.

*Primary Examiner*—Timothy P. Callahan
*Assistant Examiner*—Jung Ho Kim
*Attorney, Agent, or Firm*—Skjerven, Morrill, MacPherson, Franklin & Friel, L.L.P.; Stephen A. Terrile

[57] ABSTRACT

An embodiment of a pumped substrate system includes an oscillator, capacitive pump, comparing circuit, and a level shifter. The level shifter is coupled between the substrate and the positive input lead of the comparator and shifts the voltage level present on the substrate by a voltage Vbg. The comparator compares ground potential to the shifted substrate voltage. The oscillator, capacitive pump and comparing circuit form a negative feedback loop which operates to maintain the substrate voltage substantially equal to −Vbg. In one embodiment, the level shifter includes a band gap reference.

19 Claims, 5 Drawing Sheets

VBB REFERENCE FOR PUMPED SUBSTRATES

1. Field of the Invention

This invention relates to integrated circuits and, particularly, to integrated circuits having pumped substrates.

2. Background

Some MOS and CMOS integrated circuits have a capacitive pump circuit to control the integrated circuit's substrate voltage ("VBB") to improve performance. This scheme is sometimes called a "pumped substrate" technique. The pumped substrate system operates to back-bias the substrate to decrease body effect and reduce parasitic capacitance so that the threshold voltage (Vt) of the devices decreases without decreasing the devices' saturation current (Idsat).

Figure 1:
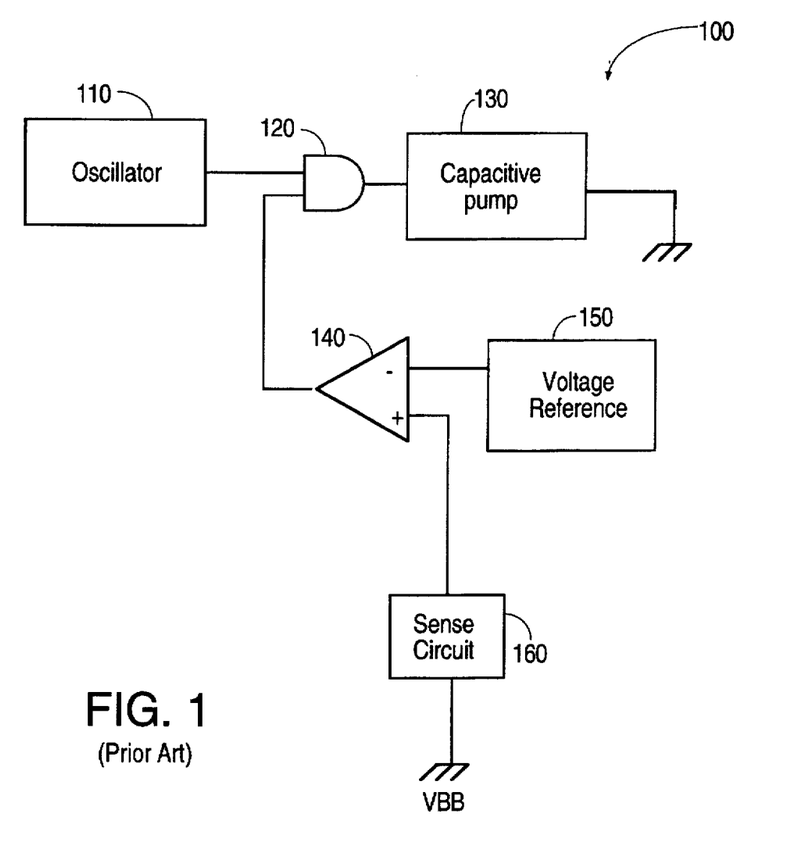
FIG. 1 shows a block diagram of a conventional pumped substrate system.

FIG. 1 shows a pumped substrate system 100 including an oscillator 110, art AND gate 120, a capacitive pump 130, a comparator 140, a voltage reference 150, and a sense circuit 160 forming a conventional pumped substrate system. Voltage reference 150 supplies a voltage Vref to the negative input terminal of comparator 140. Voltage Vref is negative so that the substrate is back-biased as described below. Sense circuit 160 senses substrate voltage VBB and provides a voltage intended to be equal to substrate voltage VBB to the positive input terminal of comparator 160. The output lead of comparator 140 is connected to one input lead of AND gate 120. The other input lead of AND gate 120 is coupled to the output lead of oscillator 110.

Thus, when substrate voltage VBB is lower (i.e., more negative) than voltage Vref, comparator 140 outputs a logic 0 signal to AND gate 120. AND gate 120 receives this logic 0 signal from comparator 140 and, as a result, AND gate 120 outputs a logic 0 signal no matter what the input is to the other input lead of AND gate 120. Thus, the clock signal generated by oscillator 110 is not transmitted to capacitive pump 130. Capacitive pump 130 is a conventional capacitive charge pump that operates to add negative charge to the substrate in response to the clock signal generated by oscillator 110. As a result, capacitive pump 130 does not add negative charge to the substrate when substrate voltage VBB is lower than voltage Vref.

On the other hand, when substrate voltage VBB is higher (i.e., more positive) than voltage Vref, comparator 140 outputs a logic 1 signal to AND gate 120. Thus, the clock signal generated by oscillator 110 is gated through AND gate 120 to capacitive pump 130. In response to the clock signal, capacitive pump 130 operates to add negative charge to the substrate, thereby causing substrate voltage VBB to decrease.

However, the negative charge pumped into the substrate will bleed from the substrate, thereby causing voltage VBB to rise. Comparator 140, AND gate 120 and capacitive pump 130 form a negative feedback loop to add negative charge to the substrate to maintain voltage VBB substantially equal to voltage Vref.

One problem of pumped substrate system 100 is in sensing substrate voltage VBB so that voltage VBB can be compared to voltage Vref. In this conventional system, sense circuit 160 is a complex circuit that is sensitive to process, temperature and power supply variations. Further, voltage reference 150 is usually implemented using P-channel devices when the substrate is P-type semiconductor material. These P-channel devices are also sensitive to these same variations. As a result, substrate voltage VBB can vary as much as −0.5V to −2.5V in pumped substrate system 100, which is unacceptable in many applications.

SUMMARY

In accordance with the present invention, a method for maintaining the voltage of a substrate at a desired level is provided, along with a structure for implementing the method. The method employs a level shifter for shifting the voltage at the substrate for comparison with a convenient voltage.

According to one embodiment of the present invention, a pumped substrate system includes an oscillator, capacitive pump, comparing circuit, and a level shifter. The level shifter is coupled between the substrate and the positive input lead of the comparing circuit and shifts the substrate voltage by a voltage Vbg. The negative input lead of the comparator is coupled to a source of ground potential. Thus, there is no need for a complex sense circuit to sense substrate voltage VBB. The comparing circuit compares ground potential to a voltage that is substantially equal to the sum of voltage Vbg and substrate voltage VBB (i.e., Vsum). The oscillator, capacitive pump, level shifter, and comparing circuit form a negative feedback loop which operates to maintain voltage Vsum substantially equal to ground potential. As a result, substrate voltage VBB is maintained at a voltage substantially equal to −Vbg.

In this embodiment, the level shifter includes a band gap reference to generate voltage Vbg. Thus, voltage Vbg is relatively insensitive to process, temperature, and power supply variations. As a result, substrate voltage VBB is maintained at a desired voltage, which is also relatively insensitive to process, temperature, and power supply variations.

In this embodiment, the band gap reference implementation includes PNP transistors. As a result, this embodiment is advantageously used in integrated circuits using N-well processes so that the band-gap reference can be implemented using the parasitic vertical PNP transistors available in all N-well processes.

DETAILED DESCRIPTION

Figure 2:
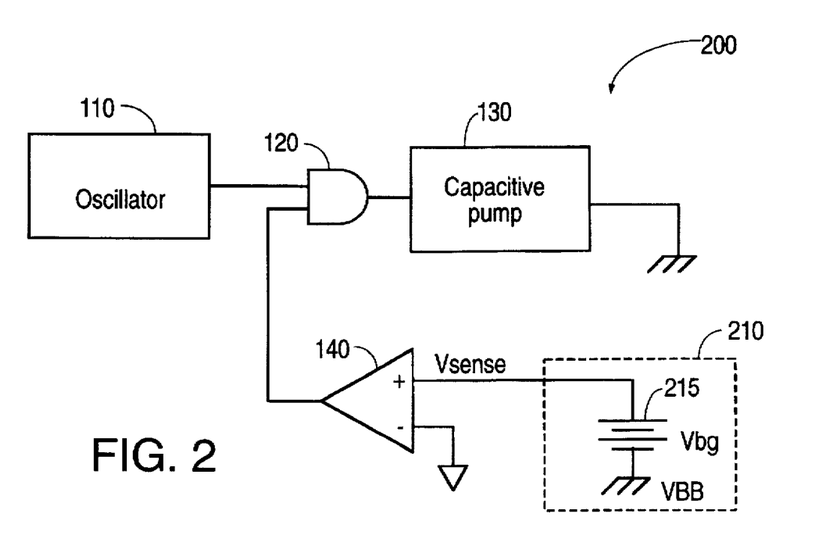
FIG. 2 shows a block diagram of a pumped substrate system according to one embodiment of the present invention.

FIG. 2 shows a pumped substrate system 200 including oscillator 110, AND gate 120, capacitive pump 130, comparator 140 and a level shifter 210. Like reference numerals are used between drawings for like elements.

Figure 3:
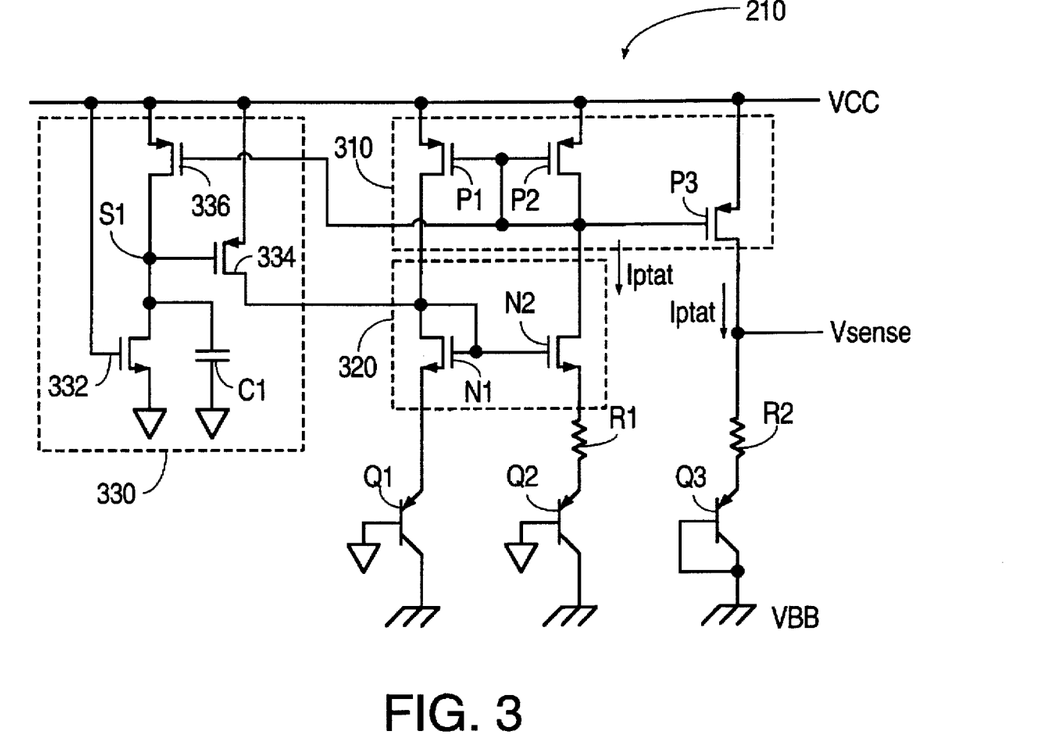
FIG. 3 shows a schematic diagram of one embodiment of the level shifter circuit depicted in FIG. 2.

Level shifter 210 includes a band gap reference 215, which outputs a voltage Vbg. In this embodiment, voltage Vbg is designed to be approximately 1.5V. Although 1.5V is used in this embodiment, the band gap reference (described further in conjunction with FIG. 3) can be designed to supply an arbitrary voltage between approximately a $VBE_{ON}$ above ground potential and a threshold voltage Vt below VCC. Band gap reference 215 is coupled between the output terminal of level shifter 210 and the substrate. As a result, level shifter 210 generates a voltage Vsense, given by the equation $$Vsense=VBB+Vbg \text{ or } Vsense=VBB+1.5V \quad (1)$$

in this embodiment.

The output lead of level shifter 210 is coupled to the positive input lead of comparator 140. The other input lead of comparator 140 is coupled to a source of ground potential. Thus, when substrate voltage VBB is less than −1.5V, voltage Vsense is negative, thereby causing comparator 140 to output a logic 0 signal. The output lead of comparator 140 is coupled to one input lead of AND gate 120 and, thus, AND gate 120 also outputs a logic 0 signal. The other input lead of AND gate 120 is coupled to the output lead of oscillator 110. Consequently, AND gate 120 does not gate the clock signal generated by oscillator 110 to capacitive pump 130, which is coupled to the output lead of AND gate 120. In this embodiment, oscillator 110 outputs a clock signal having a frequency of approximately 40 MHz.

Although an AND gate is used in this embodiment to gate the clock signal to capacitive pump 130, other embodiments may use different gating circuits, such as a NAND gate, a multiplexor, or a switch (provided the switch's output lead, coupled to capacitive pump 130, is not allowed to float).

Capacitive pump 130 is a conventional charge pump having an output lead coupled to the substrate and operates to pump negative charge into the substrate in response to the clock signal received from oscillator 110. Accordingly, when voltage Vsense is lower than ground potential, comparator 140 outputs a logic 0 signal. Consequently, AND gate 120 does not gate the clock signal from oscillator 110, which causes capacitive pump 130 to not operate.

On the other hand, when substrate voltage VBB is greater than −1.5V, level shifter 210 outputs a positive voltage Vsense. As a result, comparator 140 outputs a logic 1 signal, thereby causing AND gate 120 to gate the clock signal generated by oscillator 110 to capacitive pump 130. Capacitive pump 130 operates to pump negative charge into the substrate in response to the clock signal received from oscillator 110, thereby causing substrate voltage VBB to decrease.

Capacitive pump 130 will continue to pump negative charge into the substrate until substrate voltage VBB decreases below −1.5V. Then, as described above, comparator 140 will cause AND gate 120 to stop gating the clock signal to capacitive pump 130. However, as negative charge bleeds from the substrate, substrate voltage VBB will eventually rise above −1.5V, which will be detected by comparator 140, which will in turn cause AND gate 120 to gate the clock signal from oscillator 110 to operate capacitive pump 130. Thus, the feedback loop formed by level shifter 210, comparator 140, AND gate 120 and capacitive pump 130 operates to maintain substrate voltage VBB at substantially −1.5V.

Level shifter 210 and comparator 140, coupled as shown in FIG. 2, provide a less complex circuit for detecting substrate voltage VBB and comparing it to the desired voltage (in this case, −1.5V) than sense circuit 160 coupled and comparator 140, coupled as shown in FIG. 1. Thus, level shifter 210 is easier and less costly to implement than sense circuit 160.

Moreover, because level shifter 210 includes band gap reference 215, level shifter 210 is less sensitive than sense circuit 160 to process, temperature, and power supply variation, thereby enabling pumped substrate system 200 to more accurately maintain substrate voltage VBB at the desired voltage level.

This embodiment can be used advantageously in CMOS $E^2$ technology applications such as electrically erasable programmable logic devices (PLD) with cell devices having gate oxides of less than 100Å thickness. The term CMOS is used herein to include silicon gate technologies. The sense current (Idsat) and Vt of the cells are two important parameters that affect the performance of these PLDs. It is desirable to have a large Idsat and a low Vt to increase the PLD's speed. By back-biasing the substrate, parasitic capacitance is reduced and mobility is increased. Thus, back-biasing allows the designer to increase channel doping to increase Idsat while achieving an acceptable Vt.

Generally, Vt and Idsat both improve as substrate voltage VBB is decreased. However, in these PLD applications, substrate voltage VBB has a lower limit determined by junction breakdown of the substrate-to-N+ junctions and program retention of the application's electrically erasable cells. Because the cells are programmed with a high positive voltage on some of the cells' N+ diffusions, a large negative substrate voltage increases the risk of junction breakdown. Further, the negative substrate voltage creates an electric field between the substrate and the cells' channel which can remove charge used to program the cells. Thus, the cells can be erased if substrate voltage VBB is too negative. For these applications, a substrate voltage in the range of −1.5V±200 mV provides relatively good Vt and Idsat without a significant risk of junction breakdown and/or cell erasure.

FIG. 3 shows one embodiment of level shifter 210 comprising a P-channel current mirror 310, a N-channel current mirror 320, resistors R1 and R2, and PNP transistors Q1–Q3.

P-channel current mirror 310 comprises substantially identical P-channel transistors P1–P3. Accordingly, the currents conducted by transistors P1–P3 are substantially identical. Transistors P1–P3 of P-channel current mirror 310 each conduct current Iptat. The channels of transistors P1 and P2 are coupled to the channels of substantially identical N-channel transistors N1 and N2 of N-channel current mirror 320. Thus, N-channel transistors N1 and N2 also conduct current Iptat.

The source of transistor N1 is connected to the emitter of PNP transistor Q1. The base of transistor Q1 is coupled to a source of ground potential, and the collector of transistor Q1 is coupled to the substrate. Thus, transistor Q1 conducts the current from transistor N1 to the substrate.

The source of transistor N2 is coupled to the emitter of transistor Q2 through resistor R1. The base of transistor Q2 is coupled to a source of ground potential, and the collector of transistor Q2 is coupled to the substrate. Thus, transistor Q2 conducts the current from transistor N2 to the substrate.

The current conducted by the transistors of N-channel current mirror 320 is determined as follows. Because the bases of transistors Q1 and Q2 are coupled to a source of ground potential, the voltage loop equation from the base of transistor Q1 to the base of transistor Q2 is:

$$VBE_{Q1}+(Iptat)(R1)-VBE_{Q2}=0, \text{ or } Iptat=(VBE_{Q1}-VBE_{Q2})/R1 \quad (2)$$

where R1 is the resistance of resistor R1, $VBE_{Q1}$ is the base-to-emitter voltage of transistor Q1, and $VBE_{Q2}$ is the base-to-emitter voltage of transistor Q2. The base-to-emitter voltage of a PNP transistor is:

$$VBE = (-V_T)(ln[I_C/I_S]) \quad (3)$$

where $V_T$ is the thermal voltage, $I_C$ is the collector current and $I_S$ is the saturation current of the transistor. Combining equation (3) and equation (2) results in:

$$Iptat = (V_T)(ln[I_{CQ1}/I_{SQ1}] - ln[I_{CQ2}/I_{SQ2}])/R1 \text{ or } Iptat = (V_T)(ln[I_{SQ2}/I_{SQ1}])/R1 \quad (4)$$

because the collector currents of transistors Q1 and Q2 are substantially equal.

Because $I_S$ is proportional to cross-sectional area of the transistor's emitter, for a given process, equation (4) reduces to:

$$Iptat = (V_T)(ln[A])/R1 \quad (5)$$

where A is the ratio of emitter area of transistor Q2 to the emitter area of transistor Q1. Further, thermal voltage $V_T$ is given by:

$$V_T = kT/q \quad (6)$$

where k is Boltzmann's constant, T is the temperature in ° K., and q is the charge of an electron. Thus, equation (5) can be rewritten to:

$$Iptat = (kT/q)(ln[A])/R1 \quad (7)$$

by combining equations (5) and (6). Equation (7) shows that current Iptat is proportional to absolute temperature.

Referring back to FIG. 3, the drain of P-channel transistor P3 is coupled through resistor R2 to the emitter of diode-connected PNP transistor Q3. The collector of transistor Q3 is coupled to the substrate. Thus, transistor P3 of P-channel current mirror 310 conducts current Iptat through resistor R2 and PNP transistor Q3 to the substrate. Therefore, the voltage drop across resistor R2 and transistor Q3 is given by:

$$Vsense - VBB = (Iptat)(R2) + VBE_{Q3}, \text{ or } Vsense - VBB = (kT/q)(ln[A])(R2/R1) + VBE_{Q3} \quad (8)$$

where R2 is the resistance of resistor R2, and voltage Vsense is the voltage supplied to the positive input terminal of comparator 140. Equation (8) defines a voltage in the form of the sum of a base-emitter voltage and the product of the thermal voltage and a constant, which is the standard relation for a band gap reference. Thus, the emitter area ratio of transistors Q2 to Q1, resistance ratio of resistors R2 to R1, and the threshold voltage of transistor Q3 can be determined so that the voltage drop across resistor R2 and transistor Q3 is substantially equal to 1.5V. The positive proportionality of current Iptat offsets the negative temperature coefficient of the base-to-emitter voltage of PNP transistor Q3 to make a relatively temperature insensitive reference.

In this embodiment of level shifter 210, A is designed to be approximately 10, the ratio of resistor R2 to resistor R1 is approximately 12, and $VBE_{Q3}$ is approximately 700 mV. Typically, $VBE_{Q3}$ is set by the process, and A and the resistor ratio are varied to achieve the desired voltage. It is understood that A cannot be equal to 1 for the band gap reference to work as intended.

This embodiment of level shifter 210 results in a fractional temperature coefficient ($TC_F$) of ±300 ppm/° C. Thus, over a 100° C. temperature range, the voltage change is less than 100 mV, which is well within the voltage limits (i.e., 1.5V±200 mV) of this application.

Although the embodiment of band gap reference 215 of FIG. 3 has the bases of transistors Q1 and Q2 coupled to a source of ground potential, these transistors could just as well be diode connected without altering the function of the circuit. Further, current mirrors 310 and 320 can be scaled, which will in turn scale the voltage drop across resistor R2. Still further, current mirrors 310 and 320 can be implemented with Wilson or cascode current sources.

Current mirrors 310 and 320 have two stable states. The desired stable state, described above, is where current mirrors 310 and 320 conduct current Iptat. The other stable state is where current mirrors 310 and 320 do not conduct any current. Level shifter 210 includes a start-up circuit 330 to ensure that current mirrors 310 and 320 conduct current Iptat after receiving power.

Start-up circuit 330 includes a N-channel transistor 332 having its gate coupled to the source of voltage VCC and its source coupled to a source of ground potential. Shortly after the VCC voltage source begins supplying power (i.e., when voltage VCC reaches the threshold voltage of transistor 332), transistor 332 turns on and pulls the voltage at a node S1 to approximately ground potential. A capacitor C1 can be optionally coupled between node S1 and a source of ground potential, which serves to add a small delay to help ensure proper start up.

Node S1 is connected to a gate of a P-channel transistor 334. The source of transistor 334 is coupled to a source of voltage VCC. As a result, when transistor 332 pulls down the voltage on node S1 below voltage VCC minus a threshold voltage, transistor 334 turns on. The drain of transistor 334 is connected to the gates of transistors N1 and N2, which causes transistors N1 and N2 to become conductive. The current in the drain of transistor N2 turns on transistors P2 and P1, which then supplies current to transistor N1. The current in transistor N1 then sustains the current in transistor N2, and the circuit now operates normally.

Start-up circuit 330 further comprises a P-channel transistor 336. Transistor 336 also has a gate coupled to the drain of transistor P2 and, consequently, as the current in transistors N1, N2, Q1 and Q2 causes transistors P1 and P2 to conduct current, transistor 336 becomes conductive. Because transistor 336 is much larger than transistor 332, transistor 336 pulls up the voltage at node S1 to be approximately equal to voltage VCC. Thus, transistor 334 is turned off, thereby isolating start-up circuit 330 from current mirrors 310 and 320.

Figure 4:
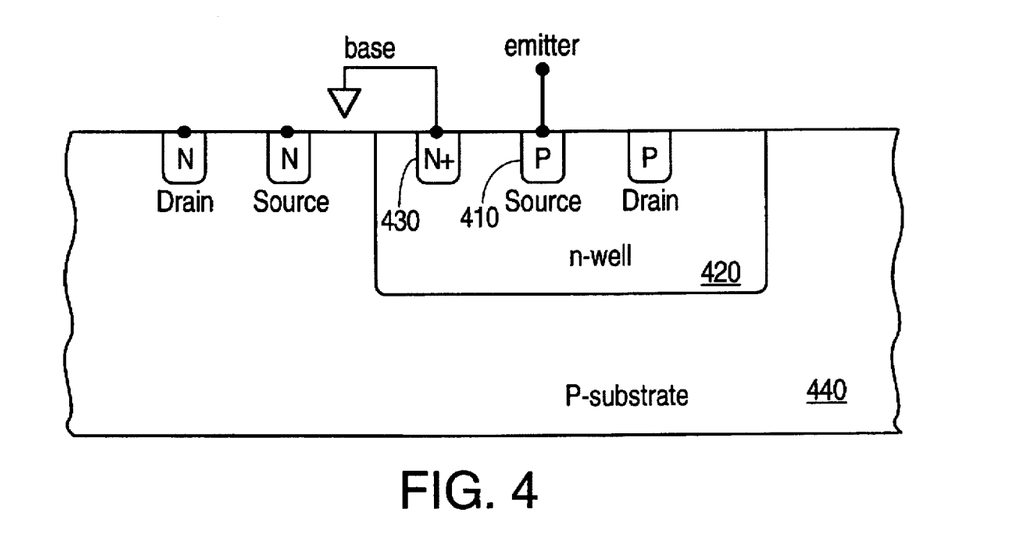
FIG. 4 shows a cross-sectional view of the PNP transistors depicted in FIG. 3.

FIG. 4 shows a diagram of the implementation of PNP transistor Q1. PNP transistors Q2 and Q3 are implemented in substantially the same manner. As stated above, pumped substrate system 200 (FIG. 2) is used in a CMOS application. In this CMOS application, the P-channel devices are implemented with a N-well in a P-substrate. The PNP transistors are implemented using the parasitic vertical PNP transistors inherent in the N-well process. The N-channel device, the gates, and the gate oxides of the CMOS device are not used in the PNP transistor implementation and need not be formed. Source diffusion 410 forms the emitter of the PNP transistor. N-well 420 forms the base of the PNP transistor. N+ diffusion 430 couples the base to a source of ground potential. P-substrate 440 forms the collector.

Figure 5:
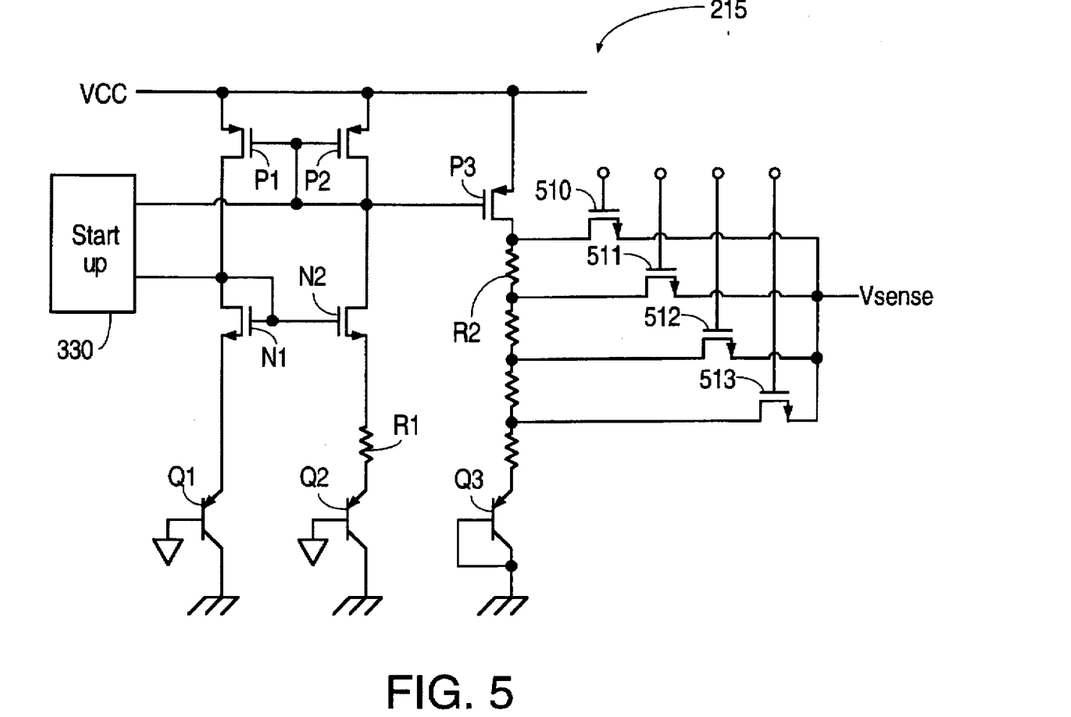
FIG. 5 shows a schematic diagram of another embodiment of the level shifter circuit depicted in FIG. 2.

FIG. 5 shows an embodiment of programmable level shifter 215' with FET 510–513 to tap resistor R2. Level shifter 215' is similar to level shifter 215 (FIG. 3) except that resistor R2 of level shifter 215 is replaced with programmable resistor R2'. The resistance of resistor R2' is programmed by providing control signals to the gates of FETs 510–513 to switch FETs 510–513 ON or OFF. Because resistor R2' may be "trimmed", this embodiment is used advantageously in applications where the VBE of transistor Q3 varies with process so that the voltage drop across resistor R2' can be adjusted to set voltage Vbg substantially equal to 1.5V. Although in this embodiment resistor R2' is programmable, resistors R1 and/or R2' may be programmable in other embodiments.

Figure 6:
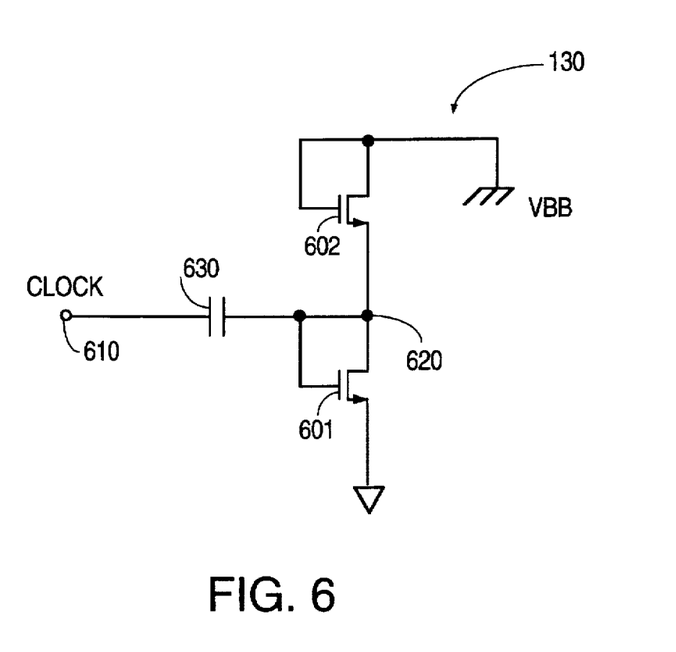
FIG. 6 shows a schematic diagram of one embodiment of the capacitive pump depicted in FIG. 2.

FIG. 6 shows one embodiment of the capacitive pump 130 comprising N-channel transistors 601 and 602 having their channels connected in series between a source of ground potential and the substrate. N-channel transistors 601 and 602 are diode-connected, with the source of transistor 601 coupled to a source of ground potential and the drain of transistor 601 coupled to the source of transistor 602. The drain of transistor 602 is coupled to the substrate. Because transistors 601 and 602 form diodes, during normal operation, positive charge can only flow from the substrate to the source of ground potential.

Clock terminal 610 is coupled to node 620 through a capacitor 630. Node 620 is located at the anode of the diode formed by transistor 601 and the cathode of the diode formed by transistor 602. In this embodiment, capacitor 630 has a capacitance of approximately 20 pF. Capacitive pump 130 receives the clock signal generated by oscillator 110 at clock terminal 610. Thus, when the clock signal nears its peak positive voltage, capacitor 630 couples this positive voltage to node 620, causing transistor 601 to become conductive and transistor 602 to become non-conductive. As a result, transistor 601 conducts charge from capacitor 630 to the source of ground potential.

Conversely, in the second half of the clock cycle, capacitor 630 couples node 620 to its most negative value, causing transistor 601 to be non-conductive and transistor 602 to become conductive. Consequently, transistor 602 conducts positive charge from the substrate to capacitor 630. Charge pump 130 can vary substrate voltage VBB to approximately $-VCC+$two diode drops (i.e., $-VCC+2V_{TN}$). Thus, as the clock signal from oscillator 110 transitions from high-to-low and low-to-high, positive charge is pumped from the substrate to the source of ground potential. This operation is equivalent to pumping negative charge into the substrate.

Figure 7:
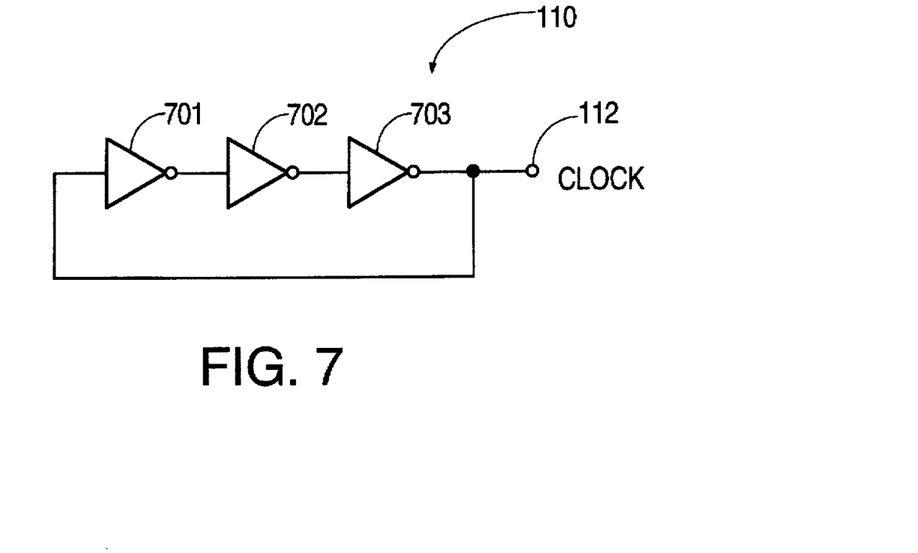
FIG. 7 shows a schematic diagram of one embodiment of the oscillator depicted in FIG. 2.

FIG. 7 shows a schematic diagram of one embodiment of oscillator 110 (FIG. 2). Oscillator 110 is a simple ring oscillator with three inverters 701–703 cascaded, with the output lead of inverter 703 connected to the input lead of inverter 701. The output signal of any of inverters 701–703 approximates a square wave. In this embodiment, the average propagation delay of the inverters is approximately 4.16 ns. As a result, oscillator 110 has a cycle time of approximately 25 ns, thereby providing a clock signal of approximately 40 MHz.

Figure 8:
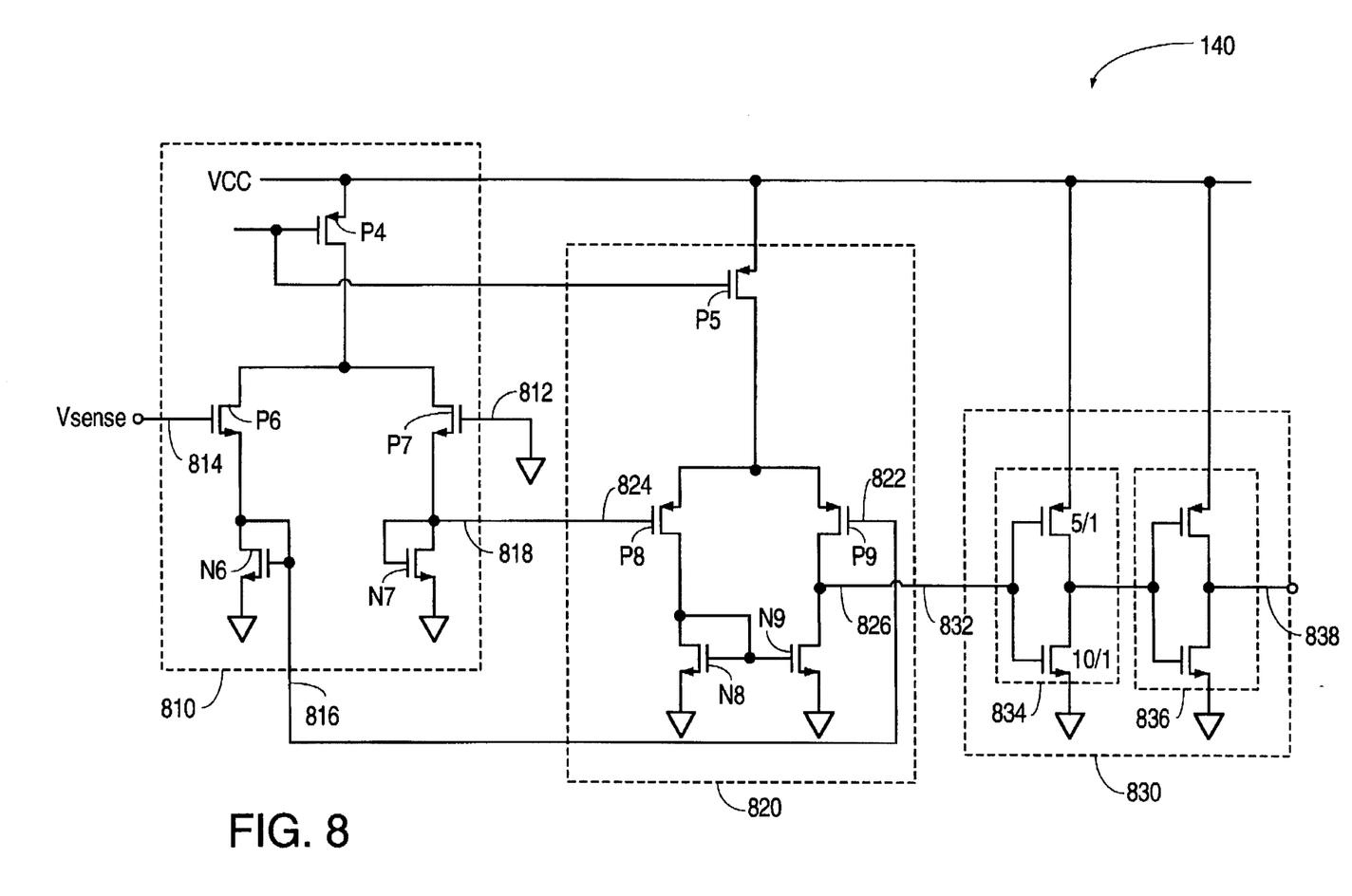
FIG. 8 shows a schematic diagram of one embodiment of the comparator depicted in FIG. 2.

FIG. 8 shows a schematic diagram of one embodiment of comparator 140 (FIG. 2). Comparator 140 includes an input stage 810 having input leads 812 and 814 respectively coupled to a source of ground potential and the output lead of level shifter 210 (FIG. 2). Input stage 810 has output leads 816 and 818 coupled to a second gain stage 820 at input leads 822 and 824, respectively. An output lead 826 of active-load stage 820 is coupled to an output stage 830 at input lead 832.

Input stage 810 includes P-channel transistor P4 having a gate coupled to P-channel current mirror 310 (FIG. 3). Transistor P4 is substantially identical to transistors P1–P3 and serves as a current source for input stage 810, providing a current, mirrored from P-channel current mirror 310, substantially equal to current Iptat.

The drain of transistor P4 is coupled to the source-coupled pair formed by P-channel transistors P6 and P7. The gate of transistor P6 serves as the positive input terminal of comparator 140 and is coupled to receive voltage Vsense from level shifter 210 (FIG. 2). The gate of transistor P7 serves as the negative input terminal of comparator 140 and is coupled to a source of ground potential. The drains of transistors P6 and P7 are coupled respectively to negative output lead 816 and positive output lead 818. The drains of transistors P6 and P7 are also coupled respectively to the drains of diode-connected N-channel transistors N6 and N7. As a result, when voltage Vsense is less than ground potential, transistor P6 becomes more conductive, thereby causing transistor P7 to conduct less current from transistor P4. Thus, the voltage at negative output lead 816 is pulled up, whereas the voltage at positive output lead 818 is pulled down.

Conversely, when voltage Vsense is greater than ground potential, transistor P6 becomes less conductive, thereby causing transistor P7 to conduct more current from transistor P4. Consequently, the voltage at negative output lead 816 is pulled down, whereas the voltage at positive output lead 818 pulled up. Accordingly, input stage 810 operates as a differential amplifier, generating a differential output signal at output leads 816 and 818.

Second gain stage 820 is a source-coupled pair with an active load. The current source for the source-coupled pair comprises P-channel transistor P5 having a gate coupled to P-channel current mirror 310 (FIG. 3). Transistor P5 is substantially identical to transistors P1–P3 and provides a current, mirrored from current mirror 310, substantially equal to current Iptat. The drain of transistor P5 is coupled to the sources of P-channel transistors P8 and P9, transistors P8 and P9 being substantially identical. The gates of transistors P8 and P9 are respectively coupled to positive input lead 824 and negative input lead 822, thereby receiving the differential output signal generated by input stage 810. The drains of transistors P8 and P9 are coupled respectively to the drains of substantially identical N-channel transistors N8 and N9.

Second gain stage 820 has a structure similar to input stage 810, except that the N-channel transistors (i.e., N8 and N9) that load the source-coupled pair (i.e., P-channel transistors P8 and P9) form a current source instead of the diodes that load the source-coupled pair in input stage 810. Only transistor N8 is diode connected, with the gate of transistor N9 coupled to the gate of transistor N8. The sources of transistors N8 and N9 are both coupled to a source of ground potential, thereby causing transistors N8 and N9 to have the same gate-to-source voltage. An output lead 826 is coupled to the drains of transistors P9 and N9. Negative input lead 822 and positive input lead 824 of second gain stage 820 are coupled respectively to negative output lead 818 and positive output lead 816 of input stage 810.

Consequently, when the voltage on positive input lead 824 rises (the voltage on negative input lead 822 decreases because of the differential output of input stage 810), transistor P8 becomes less conductive while transistor P9 becomes more conductive. Thus, the voltage at the drain of transistor P9 is pulled up, while the voltage at the drain of transistor P8 decreases.

Conversely, when the voltage on positive input lead 824 decreases (the voltage on negative input lead 822 increases because of the differential output of input stage 810), transistor P8 becomes more conductive while transistor P9 becomes less conductive. Accordingly, transistor N9 conducts more current than transistor N8. Because transistors N8 and N9 have the same gate-to-source voltage, transistor N8 enters the ohmic region of operation (i.e., a much smaller $V_{DS}$ to conduct the smaller current, which pulls down the voltage at output lead 826. Accordingly, second gain stage 820 operates as a differential amplifier generating an output signal at output lead 826.

Output lead 826 of second gain stage 820 is connected to an input lead 832 of output stage 830 comprising two inverters. An inverter 834 has an input lead coupled to input lead 832. In inverter 834, the W/L ratio of the P-channel transistor is approximately ½ of the W/L ratio of the N-channel transistor. This ratio of W/L ratios lowers the "trip" voltage of inverter 834 (i.e., the voltage above which the inverter considers the input signal a logic 1 input signal, and below which the inverter considers the input signal a logic 0 input signal) to correspond to the voltage range of the output signal generated by second gain stage 820 at output lead 826. The input lead of inverter 836 is coupled to the output lead of inverter 834, thereby inverting the output signal generated by inverter 834. Thus, comparator 140 has an even number of inversions, resulting in a non-inverted output signal being generated at output lead 838.

Figure 9:
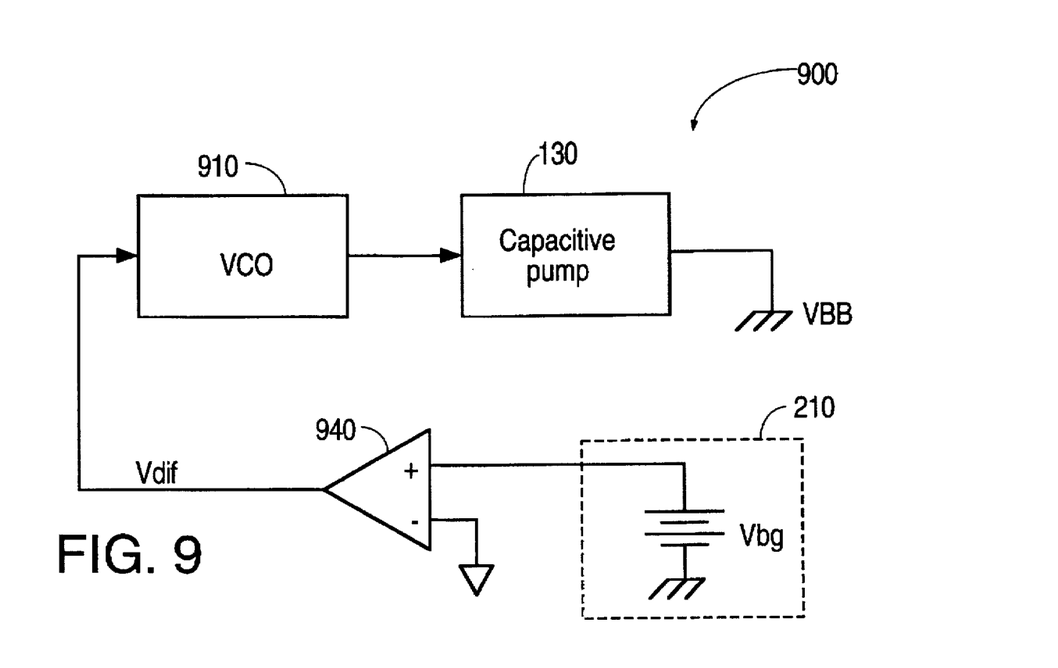
FIG. 9 shows a block diagram of a pumped substrate system according to another embodiment of the present invention.

FIG. 9 shows pumped substrate system 900 comprising a VCO 910, capacitive pump 130, level shifter 210, and an amplifier 940. Level shifter 210 and capacitive pump 130 operate as described above for pumped substrate system 200 (FIG. 2) and, thus, level shifter 210 outputs a voltage Vsense that is voltage Vbg higher than substrate voltage VBB.

Amplifier 940 operates in a manner similar to comparator 140 (FIG. 2) except that amplifier 940 outputs a voltage Vdif proportional to the voltage difference between voltage Vbg and substrate voltage VBB instead of the digital output of comparator 140. As a result, when substrate voltage VBB is slightly higher than voltage Vbg, amplifier 940 outputs a relatively small positive voltage Vdif, whereas when substrate voltage VBB is much higher than voltage Vbg, amplifier 940 outputs a relatively large positive voltage Vdif. The output lead of amplifier 940 is coupled to the input lead of VCO 910.

VCO 910 outputs a clock signal having a frequency proportional to the value of Vdif. VCO 910 is a conventional VCO. The output lead of VCO 910 is coupled to the input lead of capacitive pump 130.

Capacitive pump 130 operates to pump negative charge into the substrate. The rate at which capacitive pump 130 pumps negative charge into the substrate is proportional to the frequency of the clock signal received from VCO 910.

Amplifier 940, VCO 910, capacitive pump 130, and level shifter 210 form a feedback loop that operates to maintain substrate voltage VBB approximately equal to −1.5V. As described above in conjunction with FIG. 2, the negative charge pumped into the substrate bleeds, thereby causing substrate voltage VBB to rise. The higher substrate voltage VBB is than −1.5V, the larger the value of voltage Vdif. Consequently, VCO 910 generates a higher frequency clock signal, which in turn causes capacitive pump 130 to pump negative charge into the substrate at a greater rate. Thus, substrate voltage VBB is more quickly driven toward the desired voltage of −1.5V. As substrate voltage VBB approaches −1.5V, voltage Vdif decreases, thereby causing VCO 910 to generate a lower frequency clock signal, which in turn causes capacitive pump 130 to pump negative charge into the substrate at a lower rate. When voltage Vdif is equal to 0V, VCO 910 stops generating a clock signal. However, as negative charge bleeds from the substrate, voltage Vdif will rise above 0V, thus causing VCO 910 to output a clock signal. Thus, the feedback loop operates to continuously maintain substrate voltage VBB at the desired level of −1.5V.

The foregoing has described the principles and preferred embodiments of the present invention. However, the invention should not be construed as being limited to the particular embodiments described. For example, different implementations of the capacitive charge pump and/or amplifiers and/or band gap references may used. Further, other embodiments may be used in applications different from the CMOS $E^2$ application described herein. Still further, embodiments may be adapted for N-type substrates. Thus, the above-described embodiments should be regarded as illustrative rather than restrictive. Variations can be made to those embodiments by workers skilled in the art without departing from the scope of the present invention as defined by the following claims.

We claim:

1. A circuit implemented on a substrate having a voltage generated by a charge pump, said circuit comprising:
    a current source providing a first current that is proportional to temperature; and
    a level shifter coupled to said current source and said substrate, said level shifter providing
        a first voltage that is shifted from said voltage of said substrate, wherein said level shifter comprises:
        a first P-channel transistor coupled to said current source, said first P-channel transistor conducting a current substantially equal to said first current;
        a first resistive device coupled to a drain of said first P-channel transistor; and
        a first PNP transistor having a base and collector coupled to said substrate and an emitter coupled to said first resistive device.

2. The circuit of claim 1 wherein a voltage drop across said first resistive device and a base-to-emitter voltage of said first PNP transistor provides a voltage sum,
    said first voltage and said voltage of said substrate have a voltage difference, and
    the voltage sum is substantially equal to the voltage difference.

3. The circuit of claim 2 wherein said first voltage is substantially equal to ground potential.

4. The circuit of claim 1 wherein said current source comprises:
    P-channel current mirror for conducting a second current, the second current being substantially equal to the first current;
    a N-channel current mirror for conducting said second current from said P-channel current mirror;
    a second PNP transistor having a collector coupled to said substrate and a base coupled to a source of a second voltage;
    a second resistive device coupled between said N-channel current mirror and an emitter of said second PNP transistor; and
    a third PNP transistor having a collector coupled to said substrate, a base coupled to said source of said second voltage, and an emitter coupled to said N-channel current mirror.

5. The circuit of claim 4 wherein said second voltage is substantially equal to ground potential.

6. The circuit of claim 4 wherein said first, second, and third PNP transistors are vertical parasitic PNP transistors.

7. The circuit of claim 6 wherein said N-channel current mirror comprises:
    a first N-channel transistor having a source coupled to said emitter of said third PNP transistor; and
    a second N-channel transistor having a source coupled to said second resistive device, said second resistive device being coupled in series between said source of said second N-channel transistor and said emitter of said second PNP transistor.

8. The circuit of claim 1 wherein said emitter of said first PNP transistor is formed from a source p+ diffusion, said base of said first PNP transistor is formed from a n-well and said collector of said first PNP transistor is formed from said substrate.

9. A method for maintaining a voltage of a substrate at a predetermined level, said method comprising the steps of:
providing a first voltage that is substantially equal to a sum of a base-to-emitter voltage of a transistor and a product of a thermal voltage and a constant, wherein said constant is a product of a ratio of resistances and a natural logarithm of a ratio of emitter areas;
applying said first voltage between said substrate and a first node; and
varying a charge in said substrate to maintain a voltage of said first node at a second voltage, wherein the voltage of said substrate is maintained at said predetermined level.

10. The method of claim 9 wherein said step of providing comprises the step of varying a resistance ratio, wherein a change in said resistance ratio causes a proportional change in said constant.

11. The method of claim 9 wherein said step of providing comprises the step of varying an emitter area ratio.

12. A structure for maintaining a voltage of a substrate at a predetermined level, said structure comprising:
means for providing and applying a first voltage that is substantially equal to a sum of a base-emitter voltage of a transistor and a product of a thermal voltage and a constant, wherein said constant is a product of a ratio of resistances and a natural logarithm of a ratio of emitter areas;
said first voltage being applied between said substrate and a first node; and
means for varying a charge in said substrate to maintain a voltage of said first node at a second voltage, wherein the voltage of said substrate is maintained at said predetermined level.

13. The structure of claim 12 wherein said means for providing comprises means for varying a resistance ratio, wherein a change in said resistance ratio causes a proportional change in said constant.

14. The structure of claim 13 wherein said means for providing comprises means for varying an emitter area ratio.

15. The structure of claim 12 wherein said means for varying comprises:
means for comparing said second voltage to said voltage of said first node;
means for generating a first signal when said voltage of said first node is more positive than said second voltage.

16. The structure of claim 15 wherein said means for varying further comprises means for pumping negative charge into said substrate.

17. The structure of claim 16 wherein said means for pumping comprises:
means for providing an oscillating signal; and
means for gating said oscillating signal to a capacitive charge pump.

18. The structure of claim 17 wherein said means for gating comprises:
means for receiving said first signal on a first input lead of an AND gate; and
means for receiving said oscillating signal on a second input lead of said AND gate.

19. A system for maintaining a voltage of a substrate at a predetermined voltage, said system comprising:
an oscillator;
a gating circuit having an input lead coupled to an output lead of said oscillator;
a pump circuit having an input lead coupled to an output lead of said gating circuit and an output lead coupled to said substrate;
a level shifter coupled between said substrate and a node; and
a comparing circuit having a first input lead coupled to said node, a second input lead coupled to a voltage source and an output lead coupled to a control lead of said gating circuit;
wherein said oscillator is a voltage-controlled oscillator and said comparing circuit is an amplifier, said voltage-controlled oscillator having an input lead coupled to an output lead of said amplifier.

* * * * *

UNITED STATES PATENT AND TRADEMARK OFFICE
CERTIFICATE OF CORRECTION

PATENT NO. : 5,670,907
DATED : September 23, 1997
INVENTOR(S) : Gorecki et al.

It is certified that error appears in the above-identified patent and that said Letters Patent is hereby corrected as shown below:

Col. 1, line 16, delete "art" and insert --an--.

Signed and Sealed this

Ninth Day of June, 1998

Attest:

BRUCE LEHMAN

*Attesting Officer*     *Commissioner of Patents and Trademarks*